United States Patent
Okamoto et al.

(10) Patent No.: US 7,126,260 B2
(45) Date of Patent: Oct. 24, 2006

(54) SURFACE MOUNT CRYSTAL UNIT

(75) Inventors: Kenzo Okamoto, Saitama (JP);
Kazuhiko Osawa, Saitama (JP);
Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 167 days.

(21) Appl. No.: 10/664,733

(22) Filed: Sep. 18, 2003

(65) Prior Publication Data
US 2004/0075370 A1 Apr. 22, 2004

(30) Foreign Application Priority Data
Sep. 19, 2002 (JP) ............... 2002-272988

(51) Int. Cl.
*H01L 41/053* (2006.01)
(52) U.S. Cl. ..................................... 310/348
(58) Field of Classification Search ........ 310/340, 310/342, 345, 348, 313 R, 311
See application file for complete search history.

(56) References Cited
U.S. PATENT DOCUMENTS
4,054,807 A * 10/1977 Terayama .................. 310/348

FOREIGN PATENT DOCUMENTS

| GB | 1 465 970 | * | 3/1977 |
| JP | 63-248209 | * | 10/1988 |
| JP | 2002-084160 | | 3/2002 |
| JP | 2002-84160 | * | 3/2002 |
| JP | 2004-312057 | * | 4/2004 |

* cited by examiner

*Primary Examiner*—Thomas M. Dougherty
(74) *Attorney, Agent, or Firm*—Muirhead & Saturnelli, LLC

(57) ABSTRACT

A surface mount quartz crystal unit has a substrate for surface-mounting, a pair of connecting electrodes disposed on a principal surface of the substrate, a quartz crystal blank, and a ridge corresponding to the end of the crystal blank and disposed on the substrate in spaced relation to the connecting electrodes. The ridge has a height greater than the thickness of the connecting electrodes. An electrically conductive adhesive is applied to the connecting electrodes, a spacing between the connecting electrodes and the ridge, and an upper surface of the ridge. The crystal blank is fixed to the connecting electrodes by the adhesive at respective opposite sides of an end of the crystal blank to which extension electrodes are extended from excitation electrodes. The other end of the crystal blank remains lifted about the ridge from the principal surface of the substrate under shrinking forces of the adhesive.

14 Claims, 7 Drawing Sheets

SURFACE MOUNT CRYSTAL UNIT

BACKGROUND OF THE INVENTION

1. Field of the Invention

The present invention elates to a surface mount quartz crystal unit, and more particularly to a surface mount crystal unit which is constructed to suppress noise generated thereby.

2. Description of the Related Art

Quartz crystal units are incorporated in oscillators as a time or frequency reference source. Particularly, surface mount crystal units are small in size and weight, and hence are widely used in various portable communications devices, for example. In recent years, specifications that surface mount crystal units are required to fulfill have been becoming stricter, and there has been a demand for surface mount crystal units which produce less noise and particularly have better phase noise characteristics.

As shown in FIGS. 1A and 1B, a surface mount crystal unit comprises casing 1 having a recess defined therein, quartz crystal blank 2 disposed in the recess, and cover 3 placed on casing 1 over the recess and hermetically sealing crystal blank 2 in the recess. Casing 1 has a substantially rectangular planar shape, and is of a laminated structure of ceramics which comprises substrate 4 for surface-mounting and frame wall 5 mounted on substrate 4. Substrate 4 has a substantially rectangular planar shape, and frame wall 5 has an opening which serves as the recess in casing 1. A pair of connecting electrodes 6 for connection to crystal blank 2 is formed on respective opposite sides of one end of an inner bottom surface of the substantially rectangular recess. A pillow member 7 is mounted on the other end of the inner bottom surface of the recess. The connecting electrodes 6 are electrically connected to mounting electrodes 8 disposed on an outer surface of casing 1 via the interface across which substrate 4 and frame wall 5 are laminated and through holes (not shown) that are defined in substrate 4.

As shown in FIG. 2, crystal blank 2 comprises a substantially rectangular AT-cut quartz crystal blank. Excitation electrodes 9 are formed respectively on the principal surfaces of crystal blank 2, and extension electrodes 10 extend from respective excitation electrodes 9 to opposite sides of one end of crystal blank 2. Extension electrodes 10 are folded back a short distance over the other principal surfaces across the end of crystal blank 2.

The opposite sides of the end of crystal blank 2 are bonded to respective connecting electrodes 6 on the inner bottom surface of the recess in casing 1 by electrically conductive adhesive 11, thus electrically and mechanically connecting the opposite sides of the end of crystal blank 2 to connecting electrodes 6. The other end of crystal blank 2 is placed on pillow member 7, but is not fixed to pillow member 7.

In the case where crystal blank 2 has a beveled or convex cross-sectional shape, pillow member 7 serves to prevent the vibrating region of crystal blank 2 where excitation electrodes 9 are disposed, from contacting the inner bottom surface of the recess. Casing 1 with pillow member 7 is also used as a common component in the case where crystal blank 2 is in the form of a flat plate.

However, the surface mount crystal unit of the above construction may have its vibrating characteristics lowered when the other end of crystal blank 2 is brought into contact with pillow member 7 due to external vibrations. For example, if the surface mount crystal unit is incorporated in a cellular phone, then a noise component is added to the vibrating frequency of the crystal unit, impairing the phase noise characteristics while the cellular phone is in operation.

The other end of crystal blank 2 is disposed in abutment against or in the vicinity of pillow member 7. If a vibration source such as a motor or the like is incorporated in the portable device, then other end of crystal blank 2 is brought into intermittent contact with pillow member 7. Low-frequency vibrating sound is propagated to the other end of crystal blank 2, and then the low frequency components are added to the vibrating frequency component. As a result, the phase noise characteristics of the surface mount crystal unit is impaired.

To solve the above problem, Japanese laid-open patent publication No. 2002-84160 (JP, P2002-84160A) discloses a surface mount crystal unit that is free of a pillow member. As shown in FIG. 3A, the disclosed surface mount crystal unit has ridge 12 as a pivot for crystal blank 2 is disposed near connecting electrodes 6 on the inner bottom surface of the recess in casing 1. Electrically conductive adhesive 11 is applied to a pair of connecting electrodes 6, and the opposite sides of one end of crystal blank 2 are placed on electrically conductive adhesive 11. At this time, the other end of crystal blank 2 abuts against the inner bottom surface of the recess. FIG. 3B is a plan view of the surface mount crystal unit with a cover omitted from illustration. Each of connecting electrodes 6 is of a rectangular shape, and ridge 12 is integrally formed with connecting electrodes 6 along one side thereof. Ridge 12 extends in the direction of the shorter sides of crystal blank 2. Ridge 12 is usually made of a metal material. In FIG. 3B, crystal blank 2 is shown by the broken lines for illustrative purposes.

When electrically conductive adhesive 11 is set or cured, the other end of crystal blank 2 is lifted under shrinking forces of electrically conductive adhesive 11 as indicated by the arrows P, Q in FIG. 3C, creating and maintaining a spacing between crystal blank 2 and the inner bottom surface of the recess in casing 1. Thereafter, cover 3 is placed over the recess, thus completing the surface mount crystal unit.

However, since ridge 12 is made of the metal material, the surface mount crystal unit suffers the following problems: Electrically conductive adhesive 11, which comprises an adhesive made of an organic material mixed with an electrically conductive filler, generally has a less tendency to adhere to metal than an insulating material, i.e., ceramics. When a mechanical shock is applied to the completed surface mount crystal unit, vertically swinging the other end of crystal blank 2, electrically conductive adhesive 11 is liable to peel off the interface between itself and ridge 12 due to stresses concentrated between electrically conductive adhesive 11 and ridge 12 which functions as the pivot for crystal blank 2, as indicated by the arrow A in FIG. 4 which shows the fixed portion of crystal blank 2 at an enlarged scale. Similarly, electrically conductive adhesive 11 is liable to peel off connecting electrodes 6.

SUMMARY OF THE INVENTION

It is an object of the present invention to provide a surface mount crystal unit that has a crystal blank whose end is lifted from the inner bottom surface of a recess defined in a casing for good electric characteristics, particularly, phase noise characteristics, and has good shock resistance characteristics.

According to a first aspect of the present invention, there is provided a surface mount crystal unit comprising a substrate for surface-mounting, a pair of connecting electrodes disposed on a principal surface of the substrate, a crystal blank having excitation electrodes and extension electrodes extending from the excitation electrodes to respective opposite sides of an end of the crystal blank, the opposite sides being fixed to the connecting electrodes by an electrically conductive adhesive, and a ridge corresponding to the end of the crystal blank and disposed on the substrate in spaced relation to the connecting electrodes, the ridge having a height greater than the thickness of the connecting electrodes. The electrically conductive adhesive is applied to the connecting electrodes, a spacing between the connecting electrodes and the ridge, and an upper surface of the ridge. The crystal blank has an opposite end which remains lifted about the ridge from the principal surface of the substrate under shrinking forces of the electrically conductive adhesive.

With the above arrangement, since the opposite end of the crystal blank is lifted due to shrinkage upon setting or curing of the electrically conductive adhesive, no pillow member is required on the substrate for surface-mounting, and a gap is maintained between the crystal blank and the inner bottom surface of a recess on the principal surface of the substrate. Therefore, the opposite end of the crystal blank is prevented from contacting the inner bottom surface of the recess, so that the surface mount crystal unit maintains its electric characteristics, particularly, phase noise characteristics well. As the ridge is spaced from the connecting electrodes, the electrically conductive adhesive is joined to the exposed surface of the substrate in the spacing, and hence has an increased bonding strength. If the ridge is made of an insulating material, then the bonding strength is further increased. Consequently, the surface mount crystal unit has excellent shock resistance.

According to a second aspect of the present invention, there is also provided a surface mount crystal unit comprising a substrate for surface-mounting, a pair of connecting electrodes disposed on a principal surface of the substrate, a crystal blank having excitation electrodes and extension electrodes extending from the excitation electrodes to respective opposite sides of an end of the crystal blank, the opposite sides being fixed to the connecting electrodes by an electrically conductive adhesive, and a ridge corresponding to said end of the crystal blank and disposed on the substrate in contact with the connecting electrodes, the ridge having a height greater than the thickness of the connecting electrodes and being made of an insulating material, the electrically conductive adhesive being applied to the connecting electrodes, a spacing between the connecting electrodes and the ridge, and an upper surface of the ridge, the crystal blank having an opposite end which remains lifted about the ridge from the principal surface of the substrate under shrinking forces of the electrically conductive adhesive.

With the above arrangement, since the opposite end of the crystal blank is also lifted due to shrinkage upon setting or curing of the electrically conductive adhesive, the opposite end of the crystal blank is prevented from contacting the inner bottom surface of a recess on the principal surface of the substrate, so that the surface mount crystal unit maintains its electric characteristics, particularly, phase noise characteristics well. Since the ridge is made of an insulating material, then the bonding strength is further increased. Consequently, the surface mount crystal unit has excellent shock resistance.

DETAILED DESCRIPTION OF THE INVENTION

Figure 1A:
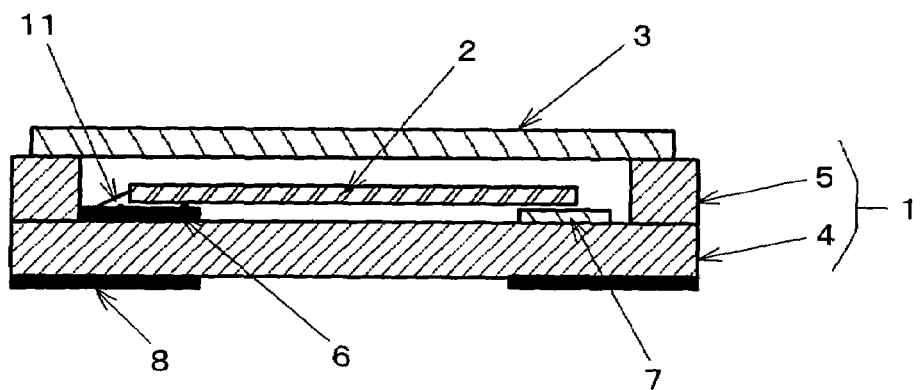
FIG. 1A is a cross-sectional view of a conventional surface mount crystal unit.
Figure 1B:
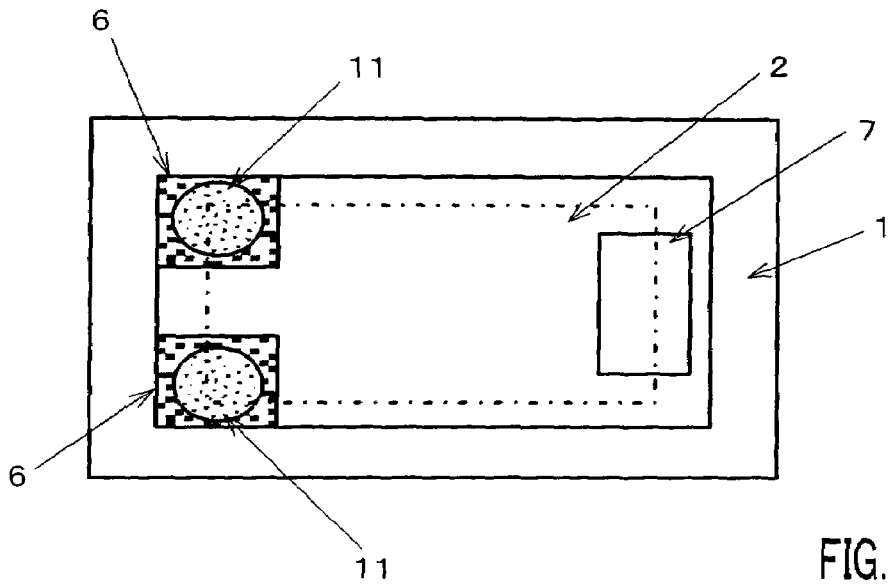
FIG. 1B is a plan view of the surface mount crystal unit shown in FIG. 1A, with a cover omitted from illustration.
Figure 2:
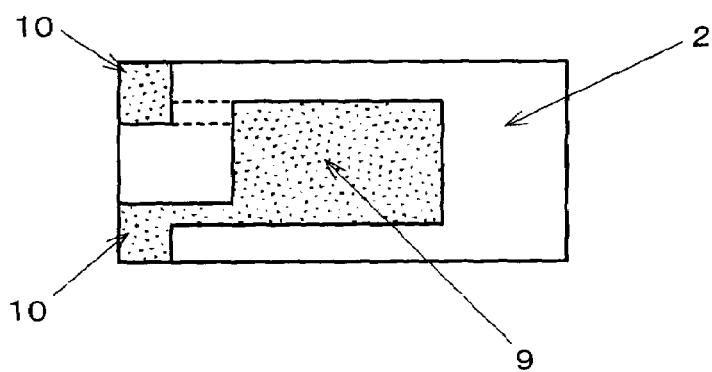
FIG. 2 is a plan view of a crystal blank.
Figure 3A:
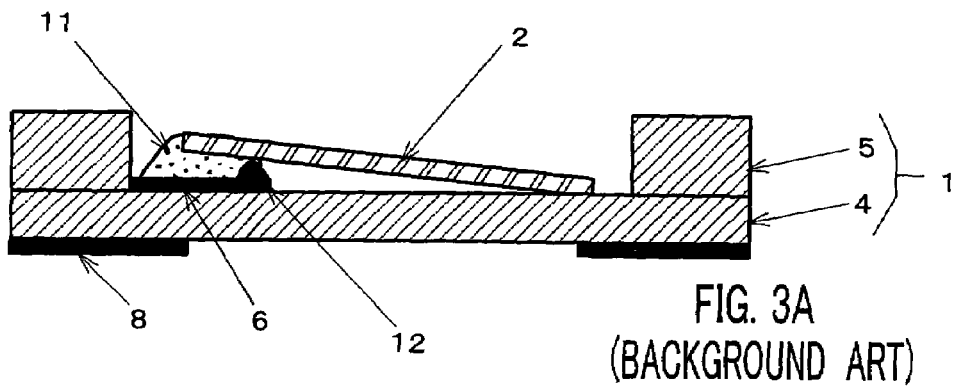
FIG. 3A is a cross-sectional view illustrative of a process of manufacturing another conventional surface mount crystal unit.
Figure 3B:
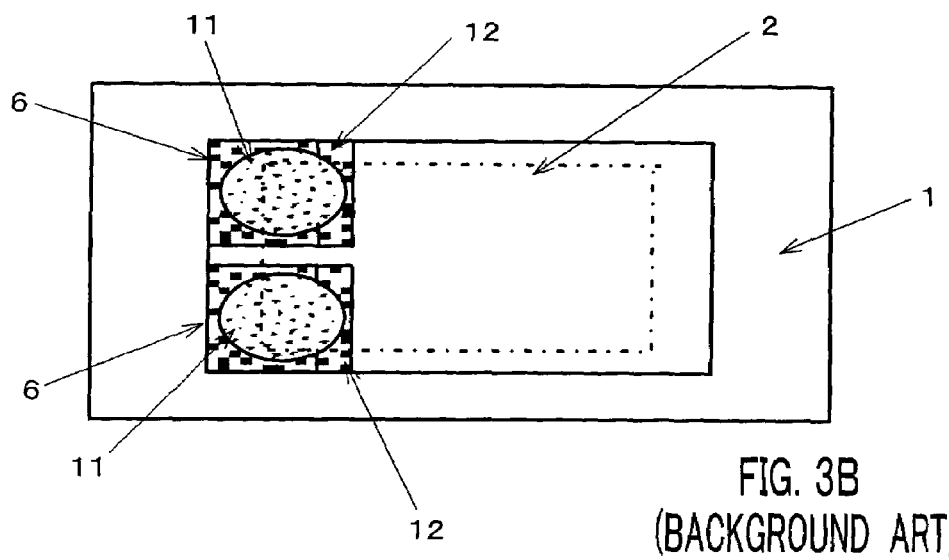
FIG. 3B is a plan view of the surface mount crystal unit shown in FIG. 3A, with a cover omitted from illustration.
Figure 3C:
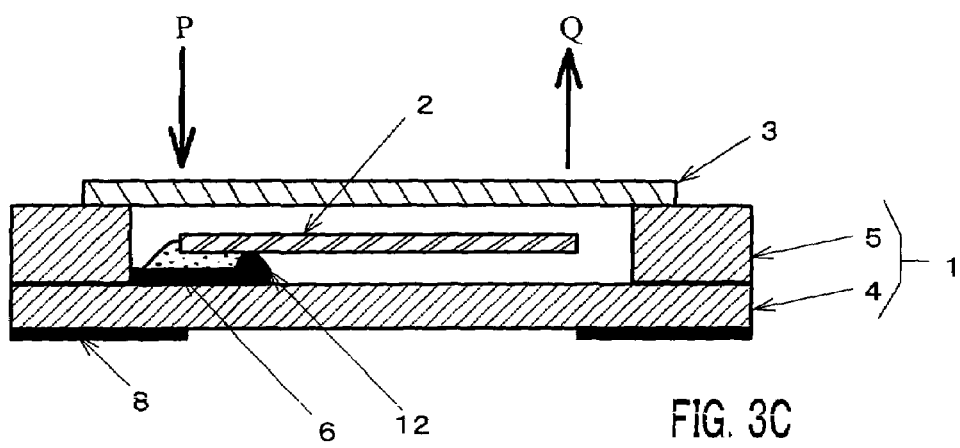
FIG. 3C is a cross-sectional view of the surface mount crystal unit shown in FIG. 3A, after an electrically conductive adhesive is set.
Figure 4:
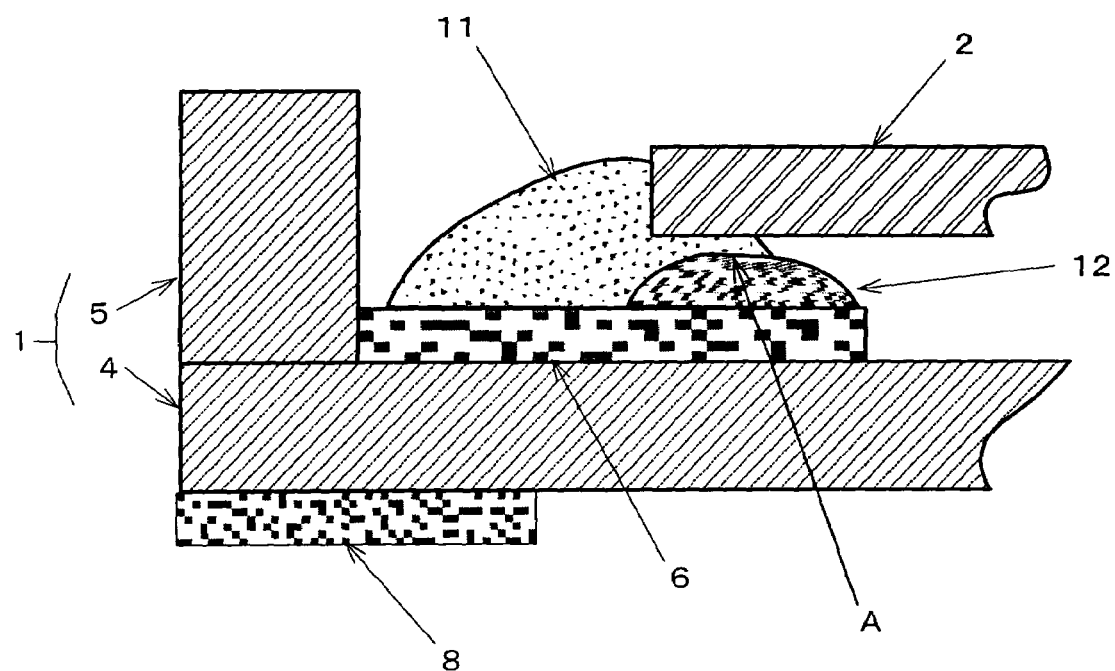
FIG. 4 is an enlarged fragmentary cross-sectional view of a portion which holds a crystal blank in the surface mount crystal unit shown in FIGS. 3A to 3C.
Figure 5:
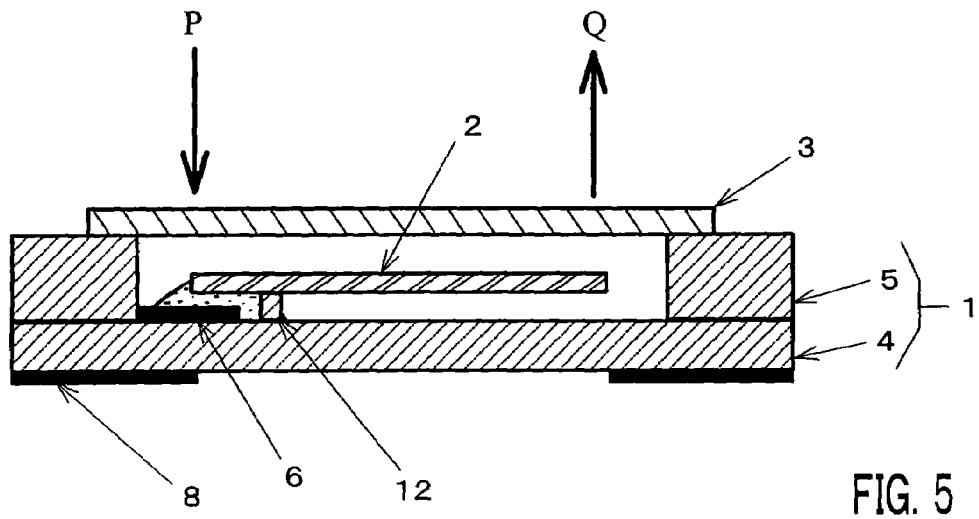
FIG. 5 is a cross-sectional view of a surface mount crystal unit according to a first embodiment of the present invention.

As shown in FIG. 5, a surface mount quartz crystal unit according to a first embodiment of the present invention comprises casing 1 having a recess defined therein, quartz crystal blank 2 disposed in the recess, and cover 3 placed on casing 1 over the recess and hermetically sealing crystal blank 2 in the recess. Casing 1 is of a laminated structure of ceramics which comprises substrate 4 for surface-mounting and frame wall 5 mounted on substrate 4, as with the casing shown in FIG. 1A. A pair of connecting electrodes 6 for connection to crystal blank 2 is formed on respective opposite sides of one end of an inner bottom surface of the recess, which is of a substantially rectangular shape. The connecting electrodes 6 are electrically connected to mounting electrodes 8 disposed on an outer surface of casing 1. Crystal blank 2 comprises an AT-cut quartz crystal blank, as with the crystal blank shown in FIG. 2. The opposite sides of an end of crystal blank 2 are bonded to respective connecting electrodes 6 on the inner bottom surface of the recess in casing 1 by electrically conductive adhesive 11, thus electrically and mechanically connecting crystal blank 2 to casing 1. Each of connecting electrodes 6 has a substantially rectangular planar shape.

The surface mount crystal unit has ridges 12 disposed on the inner bottom surface of the recess in casing 1 and spaced from connecting electrodes 6 toward the center of the recess. Ridges 12 have a height greater than the thickness of connecting electrodes 6. Ridges 12 extend parallel to respective sides of connecting electrodes 6 which are closer to the center of the recess. Ridges 12 are made of the same ceramics as casing 1, and may be formed by printing fused ceramics on substrate 4 and baking the printed ceramics and substrate 4 together. It is preferable to achieve the height of ridges 12 by printing fused ceramics in two layers on substrate 4. After electrically conductive adhesive 11 is applied to connecting electrodes 6, ridges 12, and the spacing therebetween, the opposite sides of the end of crystal blank 2 are placed on electrically conductive adhesive 11, and then electrically conductive adhesive 11 is thermoset to secure crystal blank 2 in position. At this time, crystal blank 2 has its end face and lower surface (as shown) joined to electrically conductive adhesive 11.

Figure 6A:
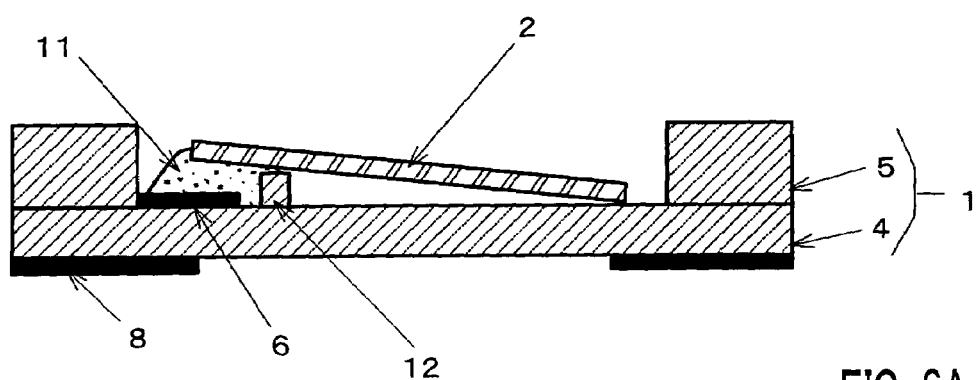
FIG. 6A is a cross-sectional view illustrative of a process of manufacturing the surface mount crystal unit shown in FIG. 5.

FIG. 6A shows the assembly at the time the opposite sides of the end of crystal blank 2 are placed on electrically conductive adhesive 11. The other end of crystal blank 2 is held in abutment against the inner bottom surface of the recess in casing 1. Thereafter, when electrically conductive adhesive 11 is thermoset or cured, as indicated by the arrows P, Q in FIG. 5, a moment tending to turn crystal blank 2 about ridges 12 is applied to crystal blank 2 due to shrinkage upon setting of electrically conductive adhesive 11. As a result, the other end of crystal blank 2 is lifted off, creating a spacing between itself and the inner bottom surface of the recess. Accordingly, even when mechanical forces such as vibrations are applied from outside to the crystal unit, crystal blank 2 is prevented from contacting the inner bottom surface of the recess or a pillow member. Therefore, the surface mount crystal unit maintains its electric characteristics, particularly, phase noise characteristics well.

Figure 6B:
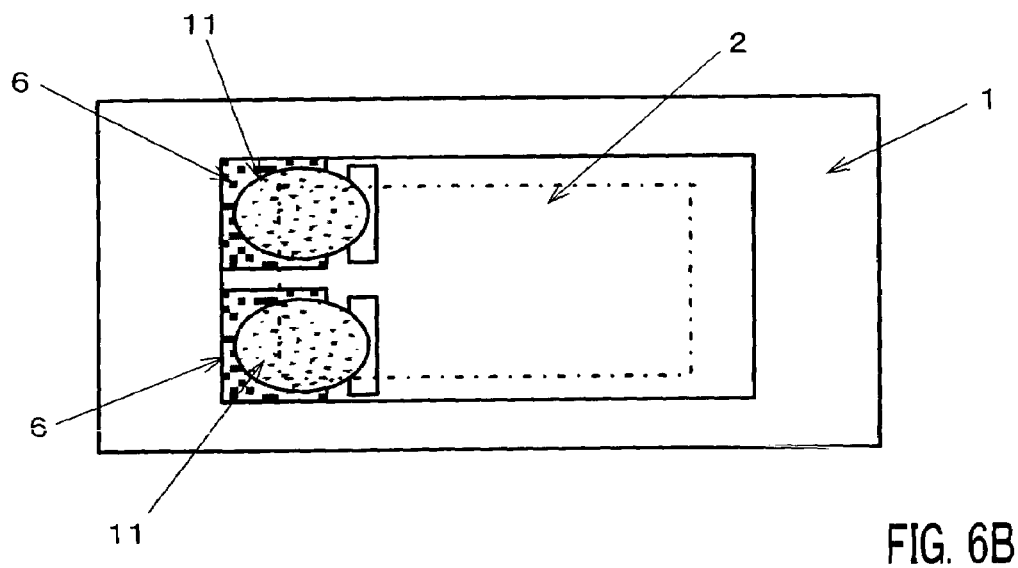
FIG. 6B is a plan view of the surface mount crystal unit according to the first embodiment, with a cover omitted from illustration.

FIG. 6B shows in plan this surface mount crystal unit with a cover omitted from illustration. In FIG. 6B, crystal blank 2 is shown by the broken lines for illustrative purposes. As shown in FIG. 6B, electrically conductive adhesive 11 is applied over connecting electrode 6, ridge 12, and the spacing therebetween with each connecting electrode 6. Since electrically conductive adhesive 11 is joined to the inner bottom surface of the spacing and side and upper surfaces of ridges 12, which are made of ceramics, i.e., an insulating material, the bonding strength between electrically conductive adhesive 11 and those members is increased. In particular, as ridges 12 are made of ceramics, even when stresses are concentrated on the interface between electrically conductive adhesive 11 and ridges 12 that serve as a pivot for quartz crystal 2, electrically conductive adhesive 11 is prevented from peeling off the interface. According to the present embodiment, therefore, even when a mechanical shock is applied from outside to the surface mount crystal unit, electrically conductive adhesive 11 is prevented from peeling off. The shock resistance of the surface mount crystal unit is thus increased.

Figure 7:
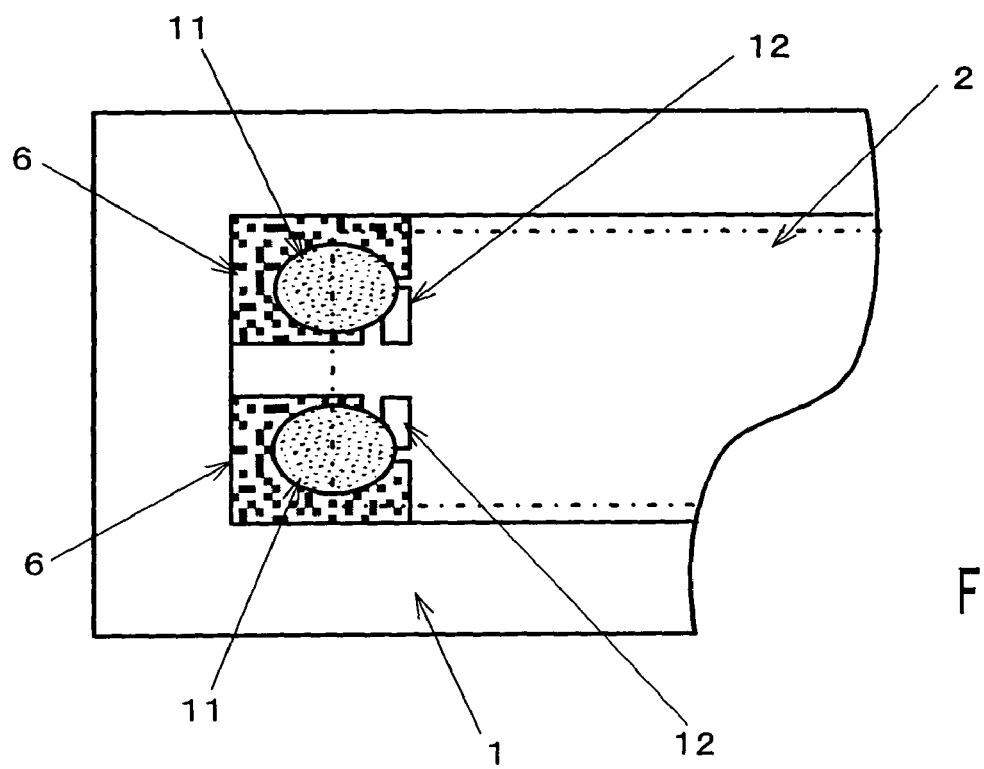
FIGS. 7 to 10 are plan views of other examples of the shape of ridges.
Figure 8:
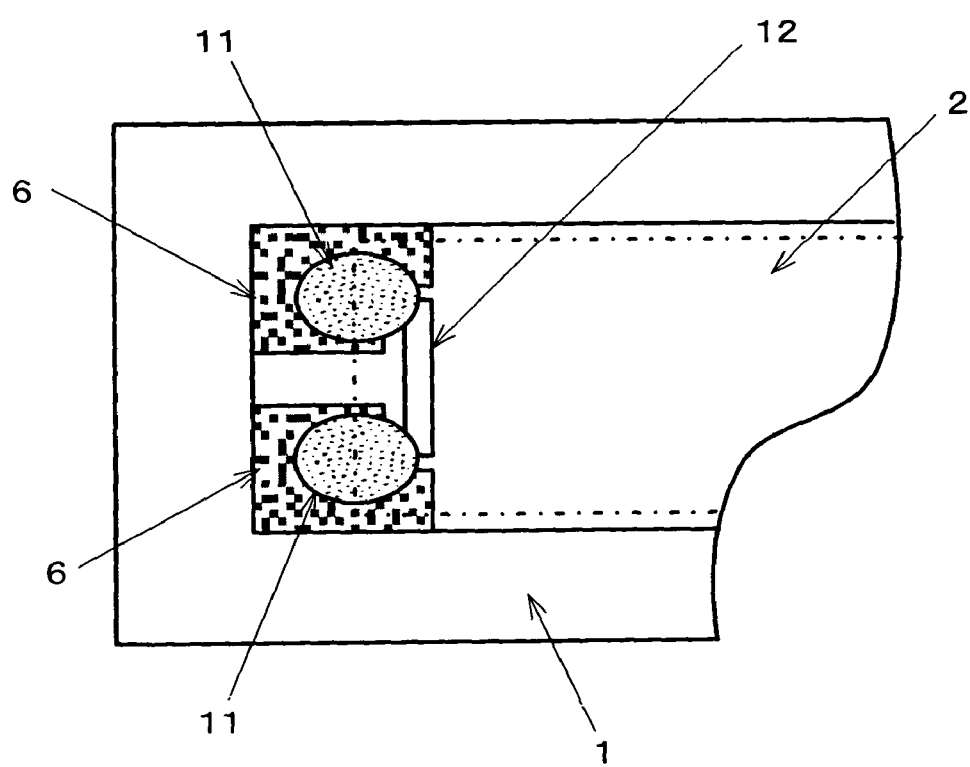
Figure 9:
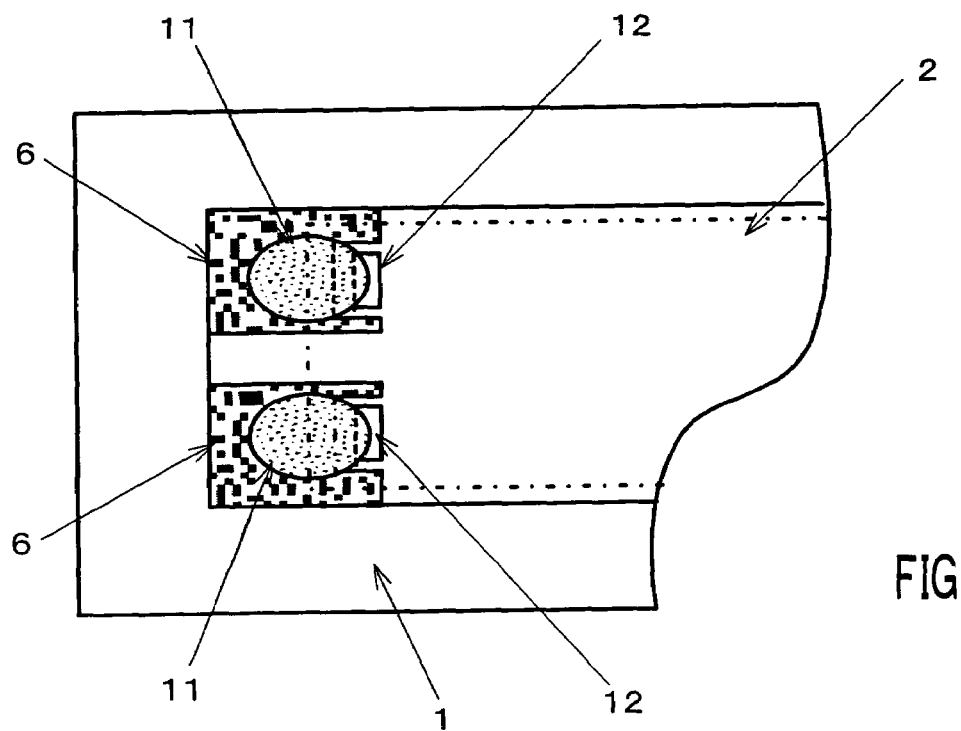
Figure 10:
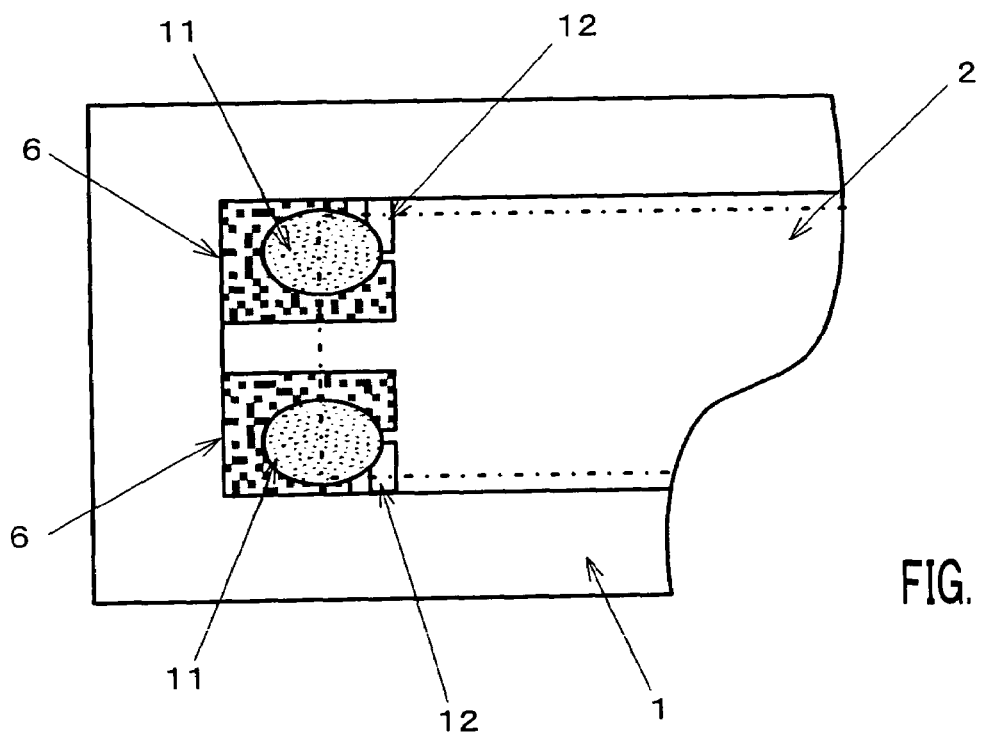

Ridges 12 disposed on the inner bottom surface of the recess in spaced relation to the connecting electrodes are not limited to the shape described above. As shown in FIG. 7, small rectangular cutouts may be defined in respective mutually facing corners of the distal ends of a pair of connecting electrodes 6, and ridges 12 may be disposed respectively in the cutouts in spaced relation to connecting electrodes 6. As shown in FIG. 8, ridges 12 may be continuously combined into an integral structure. In FIGS. 5, 6A, and 6B, two ridges may also be continuously combined into an integral structure. In FIG. 9, each connecting electrode 6 has a rectangular cutout defined substantially centrally in the side of the distal end thereof, and ridge 12 is disposed in the cutout in spaced relation to connecting electrode 6. In FIG. 10, rectangular cutouts are defined in respective corners, which face the frame wall, of the distal ends of a pair of connecting electrodes 6, and ridges 12 are disposed respectively in the cutouts in spaced relation to connecting electrodes 6. The structure shown in FIG. 9 or FIG. 10 offers the same advantages as the structure shown in FIGS. 5, 6A, and 6B.

Figure 11A:
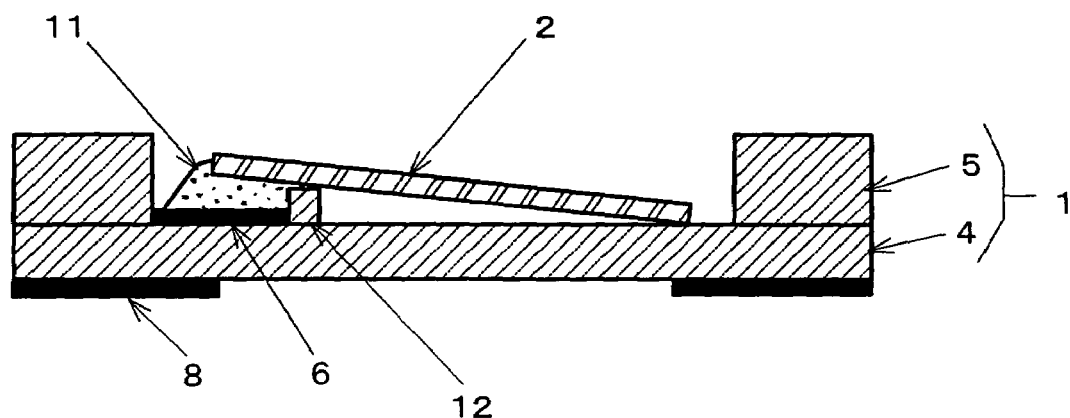
FIG. 11A is a cross-sectional view illustrative of a process of manufacturing a surface mount crystal unit according to a second embodiment of the present invention.
Figure 11B:
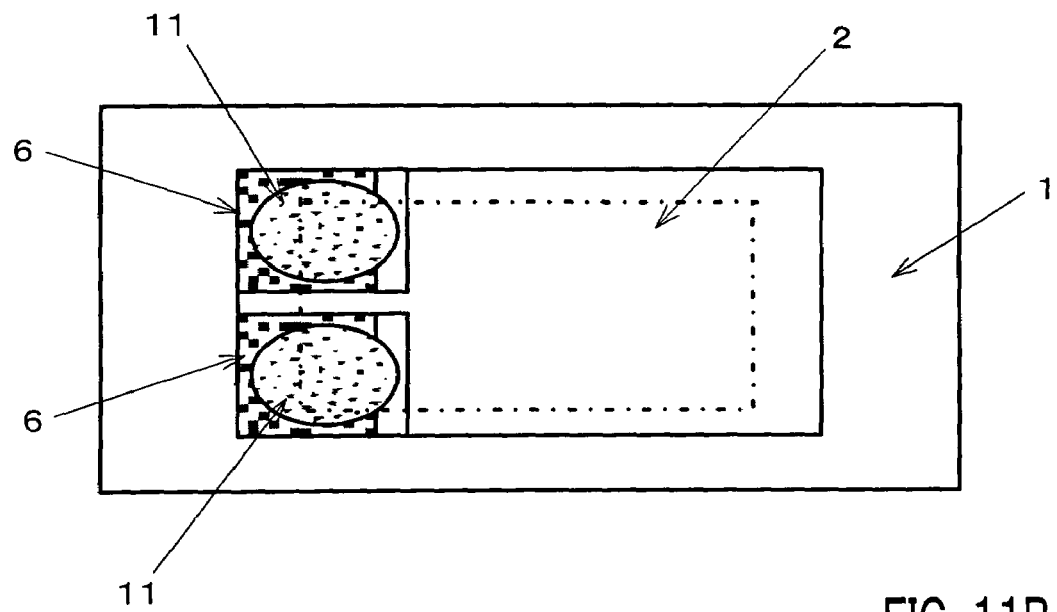
FIG. 11B is a plan view of the surface mount crystal unit according to the second embodiment, with a cover omitted from illustration.

A surface mount crystal unit according to a second embodiment of the present invention will be described below with reference to FIGS. 11A and 11B. In the first embodiment, ridges 12 are spaced from connecting electrodes 6. In the second embodiment, ridges 12 made of ceramics are disposed in contact with the distal ends of connecting electrodes 6. Since there is no spacing between connecting electrodes 6 and ridges 12, the bonding strength between electrically conductive adhesive 11 and the inner bottom surface of the recess may be smaller than the case of the first embodiment. However, electrically conductive adhesive 11 is prevented from peeling off the interface between itself and ridges 12 because electrically conductive adhesive 11 is joined to side and upper surfaces of ridges 12.

In the preferred embodiments described above, each ridge 12 has a double-layer structure formed from fused ceramics. However, the present invention is not limited to such a ridge structure. The first layer of each ridge may be made of metal and printed in the same manner as connecting electrodes 6, and only the second layer of each ridge may be made of ceramics. Such a modification offers the same advantages as described above.

In the above embodiments, electrically conductive adhesive 11 is applied to only the lower surface of crystal blank 2 including the end face. If the recess in the casing has a sufficient height, then the electrically conductive adhesive may also be applied to the upper surface of crystal blank 2 for increased bonding strength. However, if the electrically conductive adhesive were applied too much to the upper surface of crystal blank 2, then the moment which is generated due to shrinkage upon setting of the electrically conductive adhesive as described above would be unduly weak. Consequently, the electrically conductive adhesive should be applied to the upper surface of crystal blank 2 in such a quantity that will not impair the shrinking forces of electrically conductive adhesive 11 that is applied to the lower surface of crystal blank 2.

In the above embodiments, the casing has the recess defined therein. However, a casing may comprise substrate 4 only, and a cover of metal having a recess defined therein, for example, may be joined to such a casing.

Crystal blank 2 may comprise a crystal blank having beveled or convex end faces. According to such a modification, since the principal surface of the crystal blank is close to the inner bottom surface of the recess at the opposite axial ends of the crystal blank, those opposite axial ends tend to contact the inner bottom surface of the recess when vibrations or shocks are applied from outside to the crystal blank. For this reason, the other end of the crystal blank should preferably be elevated from the horizontal plane. The other end of the crystal blank may be elevated from the horizontal plane by controlling the shrinking forces of electrically conductive adhesive 11 although the effort is affected by the length of crystal blank 2.

The material of ridges 12 is not limited to the same ceramics as casing 1. Basically, ridges 12 may be made of any insulating material as its bonding strength with respect to electrically conductive adhesive 11 is high. If the ridges are spaced from the connecting electrodes, then even when the ridges are made of metal, their bonding strength with respect to electrically conductive adhesive 11 is high as electrically conductive adhesive 11 is joined to the ceramics of the inner bottom surface of the recess in the spacing. Therefore, the advantages of the present invention are also achieved.

The present invention is also applicable to a surface mount quartz crystal oscillator incorporating an integral assembly of a crystal unit and an IC (Integrated Circuit) chip that comprises an integrated oscillating circuit which employs the crystal unit. Any structures which substantially has the function of a crystal unit in which the opposite sides of one end of a crystal blank are fixed in position fall in the technical scope of the present invention.

What is claimed is:

1. A surface mount crystal unit, comprising:
   a substrate for surface-mounting;
   a pair of connecting electrodes disposed on a principal surface of said substrate;
   a crystal blank having excitation electrodes and extension electrodes extending from said excitation electrodes to respective opposite sides of an end of said crystal blank, said opposite sides being fixed to said connecting electrodes by an electrically conductive adhesive; and
   a ridge corresponding to said end of the crystal blank and disposed on said substrate in spaced relation to said connecting electrodes, said ridge having a height greater than a thickness of said connecting electrodes, wherein at least an outer portion of said ridge is an insulating material having a high bonding strength with respect to said electrically conductive adhesive;
   said electrically conductive adhesive being applied to said connecting electrodes, a spacing between said connecting electrodes and said ridge, and an upper surface of said ridge, wherein said electrically conductive adhesive is joined to said principal surface of the substrate at said spacing between said connecting electrodes and said ridge;
   said crystal blank having an opposite end which remains lifted about said ridge from said principal surface of said substrate under shrinking forces of said electrically conductive adhesive.

2. The surface mount crystal unit according to claim 1, wherein said ridge is made entirely of an insulating material.

3. The surface mount crystal unit according to claim 2, wherein said substrate and said ridge are made of ceramics.

4. The surface mount crystal unit according to claim 1, further comprising a frame wall laminated on said substrate and having an opening, said substrate and said frame wall jointly defining a recess, said crystal blank being accommodated in said recess.

5. The surface mount crystal unit according to claim 1, wherein said ridge comprises a pair of ridges associated respectively with said connecting electrodes.

6. The surface mount crystal unit according to claim 1, wherein said ridge comprises a common ridge shared by said connecting electrodes.

7. A surface mount crystal unit comprising:
   a substrate for surface-mounting;
   a pair of connecting electrodes disposed on a principal surface of said substrate;
   a crystal blank having excitation electrodes and extension electrodes extending from said excitation electrodes to respective opposite sides of an end of said crystal blank, said opposite sides being fixed to said connecting electrodes by an electrically conductive adhesive; and
   a ridge corresponding to said end of the crystal blank and disposed on said substrate in contact with said connecting electrodes, said ridge having a height greater than the thickness of said connecting electrodes and being made of an insulating material;
   said electrically conductive adhesive being applied to said connecting electrodes and an upper surface of said ridge;
   said crystal blank having an opposite end which remains lifted about said ridge from said principal surface of said substrate under shrinking forces of said electrically conductive adhesive.

8. The surface mount crystal unit according to claim 7, wherein said substrate and said ridge are made of ceramics.

9. A casing for surface mount crystal unit, comprising:
   a substrate for surface-mounting a crystal blank;
   a frame wall laminated on said substrate and having an opening, wherein said substrate and said frame wall jointly defining a recess for accepting the crystal blank;
   a pair of connecting electrodes disposed on a principal surface of said substrate; and
   a ridge corresponding to an end of said opening, said ridge being disposed on said substrate in spaced relation to said connecting electrodes and having a height greater than a thickness of said connecting electrodes, wherein at least an outer portion of said ridge is an insulating material having a high bonding strength with respect to an electrically conductive adhesive, and wherein said electrically conductive adhesive is joined to said principal surface of the substrate at a spacing between said connecting electrodes and said ridge.

10. The casing according to claim 9, wherein said ridge is made entirely of an insulating material.

11. The casing according to claim 10, wherein said ridge is made of a ceramic material.

12. The casing according to claim 10, wherein said substrate and said ridge are made of ceramic materials.

13. The casing according to claim 9, wherein said ridge comprises a pair of ridges associated respectively with said connecting electrodes.

14. The casing according to claim 9, wherein said ridge comprises a common ridge shared by said connecting electrodes.

* * * * *